(12) United States Patent
Nuetzel et al.

(10) Patent No.: US 7,183,130 B2
(45) Date of Patent: Feb. 27, 2007

(54) MAGNETIC RANDOM ACCESS MEMORY AND METHOD OF FABRICATING THEREOF

(75) Inventors: Joachim Nuetzel, Kulmbach (DE); Xian Jay Ning, Shanghai (CN); William C. Wille, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 10/604,533

(22) Filed: Jul. 29, 2003

(65) Prior Publication Data

US 2005/0023581 A1 Feb. 3, 2005

(51) Int. Cl.
*H01L 21/66* (2006.01)
*H01L 21/00* (2006.01)
*H01L 21/961* (2006.01)

(52) U.S. Cl. .................... 438/73; 438/15; 438/57; 438/728; 438/732

(58) Field of Classification Search ................ 438/618, 438/622, 98, 624, 453; 257/758, 759, 760
See application file for complete search history.

(56) References Cited

U.S. PATENT DOCUMENTS

| | | |
|---|---|---|
| 5,695,810 A | 12/1997 | Dubin et al. |
| 5,804,458 A | 9/1998 | Tehrani et al. |
| 5,920,500 A | 7/1999 | Tehrani et al. |
| 5,936,293 A | 8/1999 | Parkin |
| 6,048,739 A | 4/2000 | Hurst et al. |
| 6,147,900 A | 11/2000 | Pohm |
| 6,165,803 A | 12/2000 | Chen et al. |
| 6,351,408 B1 | 2/2002 | Schwarzl et al. |

(Continued)

OTHER PUBLICATIONS

L. G. Svendsen, T. Osaka, I. Koiwa, and H. Sawai; "Chemically Deposited Ni-P and Ni-P-W Layers Invetigated by Means of Rutherford Backscattering Spectrometry;" J. Electrochem. Soc.: Solid-State Science and Technology vol. 130 No. 11, Nov. 1983, pp. 2255-2259.

(Continued)

*Primary Examiner*—Carl Whitehead, Jr.
*Assistant Examiner*—James M. Mitchell
(74) *Attorney, Agent, or Firm*—Cantor Colburn LLP

(57) ABSTRACT

A device structure and method for forming an interconnect structure in a magnetic random access memory (MRAM) device. In an exemplary embodiment, the method includes defining a magnetic stack layer on a lower metallization level, the magnetic stack layer including a non-ferromagnetic layer disposed between a pair of ferromagnetic layers. A conductive hardmask is defined over the magnetic stack layer, and selected portions of the hardmask and the magnetic stack layer, are then removed, thereby creating an array of magnetic tunnel junction (MTJ) stacks. The MTJ stacks include remaining portions of the magnetic stack layer and the hardmask, wherein the hardmask forms a self aligning contact between the magnetic stack layer and an upper metallization level subsequently formed above the MTJ stacks.

13 Claims, 6 Drawing Sheets

U.S. PATENT DOCUMENTS

| | | |
|---|---|---|
| 6,365,419 B1 | 4/2002 | Durlam et al. |
| 6,381,170 B1 | 4/2002 | Prinz |
| 6,396,735 B2 | 5/2002 | Michijima et al. |
| 6,417,561 B1* | 7/2002 | Tuttle ........................ 257/659 |
| 6,452,764 B1* | 9/2002 | Abraham et al. ........ 360/324.2 |
| 6,706,639 B2* | 3/2004 | Parker et al. ............... 438/706 |
| 6,783,995 B2* | 8/2004 | Hineman et al. ............. 438/3 |
| 6,783,999 B1* | 8/2004 | Lee ............................... 438/3 |
| 6,784,091 B1* | 8/2004 | Nuetzel et al. ............. 438/618 |
| 6,815,784 B2* | 11/2004 | Park et al. .................. 257/421 |
| 6,884,630 B2* | 4/2005 | Gupta et al. .................... 438/3 |
| 6,977,401 B2* | 12/2005 | Hosotani .................... 257/295 |
| 2002/0098676 A1* | 7/2002 | Ning et al. ................. 438/622 |
| 2002/0155627 A1* | 10/2002 | Okazawa et al. ............... 438/3 |
| 2002/0171100 A1* | 11/2002 | Pohm ......................... 257/310 |
| 2003/0137028 A1* | 7/2003 | Hosotani et al. ........... 257/528 |
| 2003/0234449 A1* | 12/2003 | Aratani et al. .............. 257/758 |
| 2004/0018645 A1* | 1/2004 | Drewes ........................ 438/3 |
| 2005/0078417 A1* | 4/2005 | Kishi et al. .............. 360/324.2 |

OTHER PUBLICATIONS

K. K. H. Wong, S. Kaja, P. W. DeHaven; "Metallization By Plating for High-Performance Multichip Modules," IBM Research Development, vol. 42, No. 5, Sep. 1998; pp. 587-596.

L.A. D'Asaro, J. V. DiLorenzo, and H. Fukui; "Improved Performance of GaAs Microwave Field-Effect Transistors with Low Inductance Via Connections Through the Substrate;" IEEE Transactions on Electron Devices, vol. ED-25, No. 10, Oct. 1978; pp. 1218-1221.

T. Ishikawa, K. Okaniwa, M. Komaru, K. Kosaki, and Y. Mitsui; "A High-Power GaAs FET Having Buriied Plated Heat Sink for High-Performance MMIC's" IEEE Transactions on Electron Devices, vol. 41, No. 1; Jan. 1994; pp. 3-9.

* cited by examiner

MAGNETIC RANDOM ACCESS MEMORY AND METHOD OF FABRICATING THEREOF

BACKGROUND OF INVENTION

The present invention relates generally to magnetic memory devices and, more particularly, to a process sequence of fabricating magnetic random access memory (MRAM) devices.

Magnetic (or magneto-resistive) random access memory (MRAM) is a promising technology in the development of non-volatile random access memory that could begin to replace the existing dynamic random access memory (DRAM) as the standard memory for computing devices. The use of MRAM as a non-volatile RAM will eventually allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by a non-magnetic layer, and arranged into a magnetic tunnel junction (MTJ). Digital information is stored and represented in the memory element as directions of magnetization vectors in the magnetic layers. More specifically, magnetic vectors in one magnetic layer (also referred to as a reference layer) are magnetically fixed or pinned, while the magnetization direction of the other magnetic layer (also referred to as a "free" layer) may be switched between the same direction and the opposite direction with respect the fixed magnetization direction of the reference layer. The magnetization directions of the free layer are also known "parallel" and "anti-parallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistances in response to a vertically applied current with respect to the TMR device. The particular resistance of the TMR device thus reflects the magnetization state of the free layer, wherein resistance is "low" when the magnetization is parallel, and "high" when the magnetization is antiparallel. Accordingly, a detection of changes in resistance allows an MRAM device to provide information stored in the magnetic memory element (i.e., a read operation). In addition, an MRAM cell is written to through the application a bi-directional current in a particular direction, in order to magnetically align the free layer in a parallel or antiparallel state.

A practical MRAM device integrates a plurality of magnetic memory elements with other circuits such as, for example, control circuits for the magnetic memory elements, comparators for detecting the states in the magnetic memory elements, input/output circuits, etc. As such, there are certain microfabrication processing difficulties to be overcome before high capacity/density MRAM products become commercially available. For example, in order to reduce the power consumption of the device, CMOS switching technology is desirable. As is known in the art, various CMOS processing steps (such as depositing dielectric and metal layers and annealing implants) are carried out at relatively requires high temperatures (e.g., in excess of 300E C). On the other hand, magnetic layers employ ferromagnetic material, such as CoFe and NiFeCo, that requires processing temperatures below 300E C in order to prevent intermixing of magnetic materials. Thus, the magnetic memory elements need to be fabricated at a different stage after CMOS processing.

Moreover, magnetic memory elements contain components that are easily oxidized and also sensitive to corrosion. To protect magnetic memory elements from degradation and keep the performance and reliability of the MRAM device, a passivation layer is typically formed thereupon. In addition, a magnetic memory element includes very thin layers, some of them on the order tens of angstroms thick. Because the performance of the magnetic memory element is particularly sensitive to the surface conditions on which magnetic layers are deposited, it is desirable to maintain a relatively flat surface to prevent the characteristics of an MRAM device from degrading.

Notwithstanding the above described processing variations between ferromagnetic materials and conventional DRAM elements, it is desirable to be able to simplify the MRAM fabrication process and increase the compatibility thereof with conventional back-end-of-line (BEOL), e.g. copper, metallization techniques.

SUMMARY OF INVENTION

The foregoing discussed drawbacks and deficiencies of the prior art are overcome or alleviated by a method for forming an interconnect structure in a magnetic random access memory (MRAM) device. In an exemplary embodiment, the method includes defining a magnetic stack layer on a lower metallization level, the magnetic stack layer including a non-ferromagnetic layer disposed between a pair of ferromagnetic layers. A conductive hardmask is defined over the magnetic stack layer, and selected portions of the hardmask and the magnetic stack layer, are then removed, thereby creating an array of magnetic tunnel junction (MTJ) stacks. The MTJ stacks include remaining portions of the magnetic stack layer and the hardmask, wherein the hardmask forms a self aligning contact between the magnetic stack layer and an upper metallization level subsequently formed above the MTJ stacks.

In another aspect, a magnetic random access memory (MRAM) device includes a magnetic stack layer formed on a lower metallization level, the magnetic stack layer having a non-ferromagnetic layer disposed between a pair of ferromagnetic layers. A conductive hardmask is formed over the magnetic stack layer, and an array of magnetic tunnel junction (MTJ) stacks is created by the removal of selected portions of the hardmask and the magnetic stack layer. The MTJ stacks include remaining portions of the magnetic stack layer and the hardmask, wherein the hardmask forms a self aligning contact between the magnetic stack layer and an upper metallization level formed above the MTJ stacks.

BRIEF DESCRIPTION OF DRAWINGS

Referring to the exemplary drawings wherein like elements are numbered alike in the several figures.

DETAILED DESCRIPTION

Disclosed herein is an improved process Sequence of fabricating magnetic random access memory (MRAM) devices wherein, among oilier aspects, a metal hardmask is formed over a plurality of magnetic tunnel junction (MTJ) stacks thereby providing a self-aligned contact between the stacics and subsequent tipper metallization lines formed thereupon. In other words, the hardmask (being self aligned between the MTJ stasks and the upper metallization lines) serves as an electrical contact therebetween. The metal hardmask also serves as an etch stop layer for subsequent dual damaseene processing steps used in the formation of the upper metallization lines and vias connecting the ripper metallization lines to lower metallization lines (on which the MTJ stacks are formed).

Figure 1:
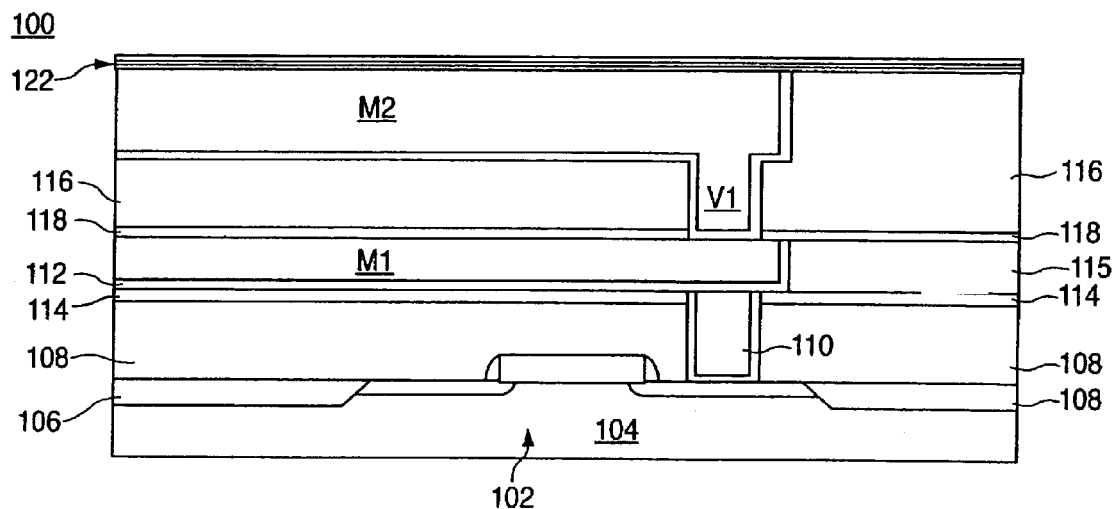
FIGS. 1–11 are sectional views of processing steps in conjunction with a method for forming a magnetic random access memory (MRAM) device, in accordance with an embodiment of the invention, in which a plurality of magnetic tunnel junction (MTJ) stacks includes a metal hardmask layer thereupon.

Referring initially to FIG. 1, there is shown a sectional view of the formation of the MTJ stacks of an MRAM device 100. Prior to the stack formation, the fabrication of the MRAM structure 100, up to the second level of metallization, is implemented in accordance with well known fabrication processes. The lower level, or front end of line (FEOL) structures, include transistor device 102 formed upon a silicon or other suitable substrate 104, along with isolation regions 106. An interlevel dielectric layer 108, such as SiO2, is used to insulate the active substrate devices (e.g., transistor 102) from a first metallization layer M1, except where the transistor 102 is connected to M1 by contact area 110.

The first metallization layer M1 is formed within a liner or barrier layer 112 (e.g., tantalum/tantalum nitride) which in turn is formed upon a nitride layer 114 on a first interlevel dielectric (ILD) layer 108. A second interlevel dielectric layer 115 is also formed upon nitride layer 114. Further, a second metallization layer M2 (and liner) is formed upon a third interlevel dielectric layer 116, wherein electrical contact between the first and second metallization layers M1, M2 is achieved through via V1. As with the second interlevel dielectric layer 115, the third interlevel dielectric layer 116 is also formed upon a nitride layer 118.

Those skilled in the art will appreciate that the first metallization layer M1, as well as the combination of via V1 and second metallization layer M2, may be formed by, for example, by conventional damascene processing and dual damascene processing, respectively. It will also be appreciated that the aforementioned FEOL structures (denoted collectively by 120 in subsequent Figures) are presented by way of example only, and are thus not discussed in further detail hereinafter.

The MTJ stack formation process begins with the deposition of a magnetic stack layer (collectively denoted by 122) deposited over the M2 lines and the ILD layer 116, and comprising a non-ferromagnetic layer sandwiched between a pair of ferromagnetic layers, allowing for spin-dependent tunneling. The ferromagnetic material used in the stack layer 122 may include materials such as IrMn, PtMn, CoFe, CoFeB, Ru, $Al_2O_3$, and NiFe for example. Other types of magnetic material, such as Ni, Co, and various ratios of the compounds mentioned above, may also be used. It should also be noted at this point that the magnetic stack layer 122 need not necessarily be formed upon M2, but could also be formed upon M1 or at a higher metallization level than M2.

Figure 2:
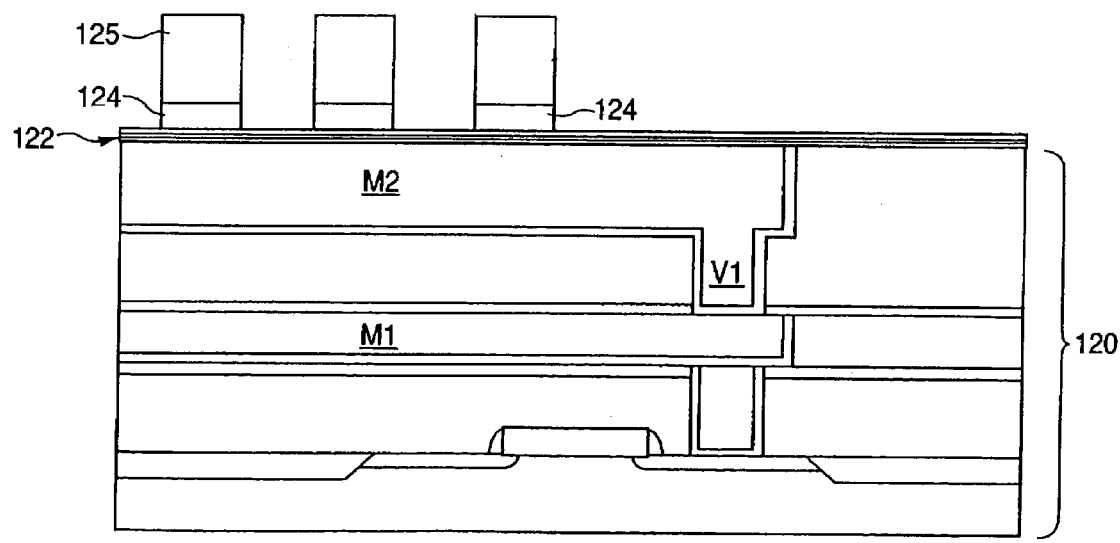

Once the magnetic stack layer 122 is deposited, a metal hardmask layer 124 is then deposited thereupon as shown in FIG. 2. In a preferred embodiment, the hardmask layer 124 includes a conductive material such as tantalum, tungsten, titanium, and compounds thereof, such as tantalum nitride or titanium nitride. However, other types of conductive materials can also be used. The hardmask layer 124 is deposited by, for example, physical vapor deposition (PVD), chemical vapor deposition (CVD), or other techniques. In addition, the thickness of the hardmask layer 124 is preferably sufficient to serve as a hardmask for etching of the magnetic stack layer 122.

Figure 3:
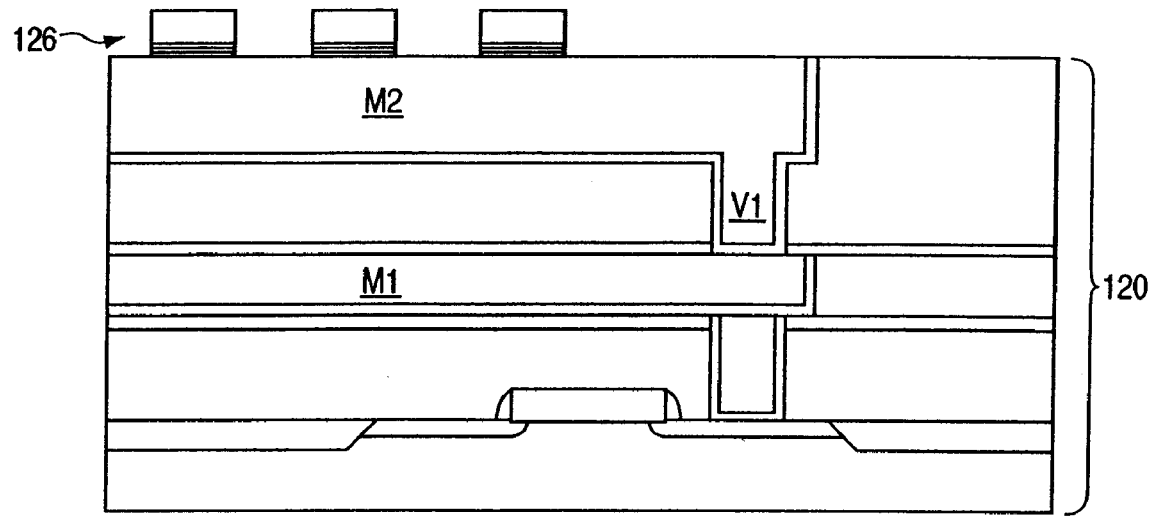
Figure 4:
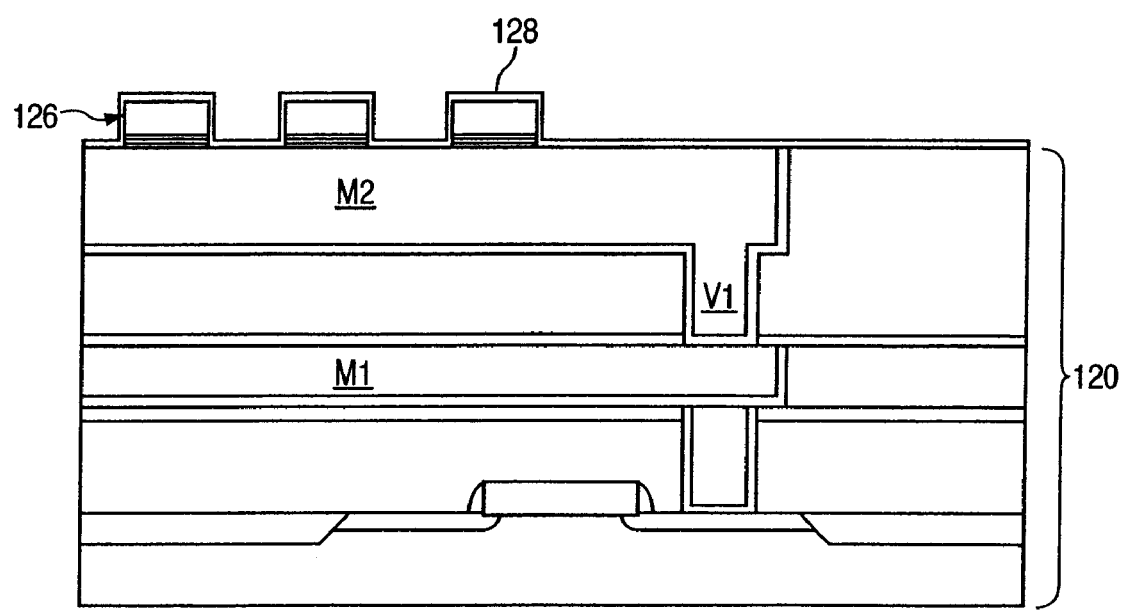

After being deposited, the hardmask layer 124 is then lithographically patterned and the resulting photo resist 125 pattern is transferred to the hardmask 124 layer by RIE, for example, as is also shown in FIG. 2. In FIG. 3, the pattern is also shown transferred into the magnetic stack layer 122 by reactive ion etching (RIE) or ion milling, for example, to define the individual MTJ stacks 126. Once the MTJ stacks 126 are defined, a cap layer 128 is deposited to seal the exposed portions of the M2 surface in subsequent processing steps, as shown in FIG. 4. The cap layer 128 may be, for example, a layer of silicon nitride deposited by CVD.

Figure 5:
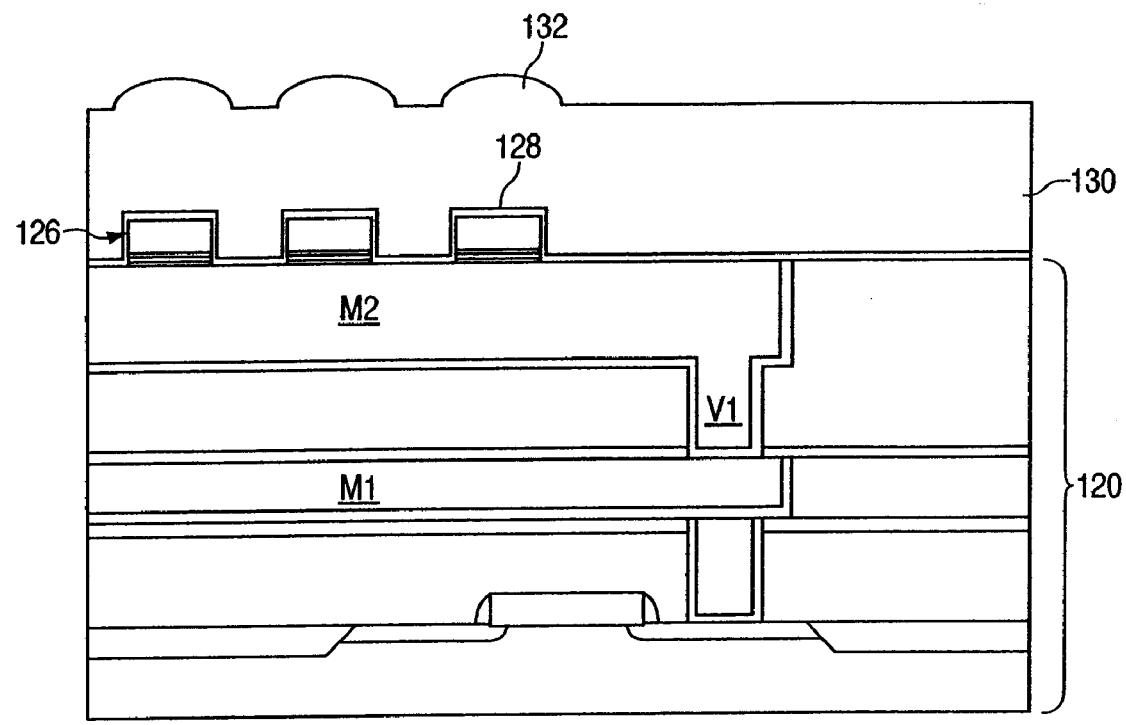
Figure 6:
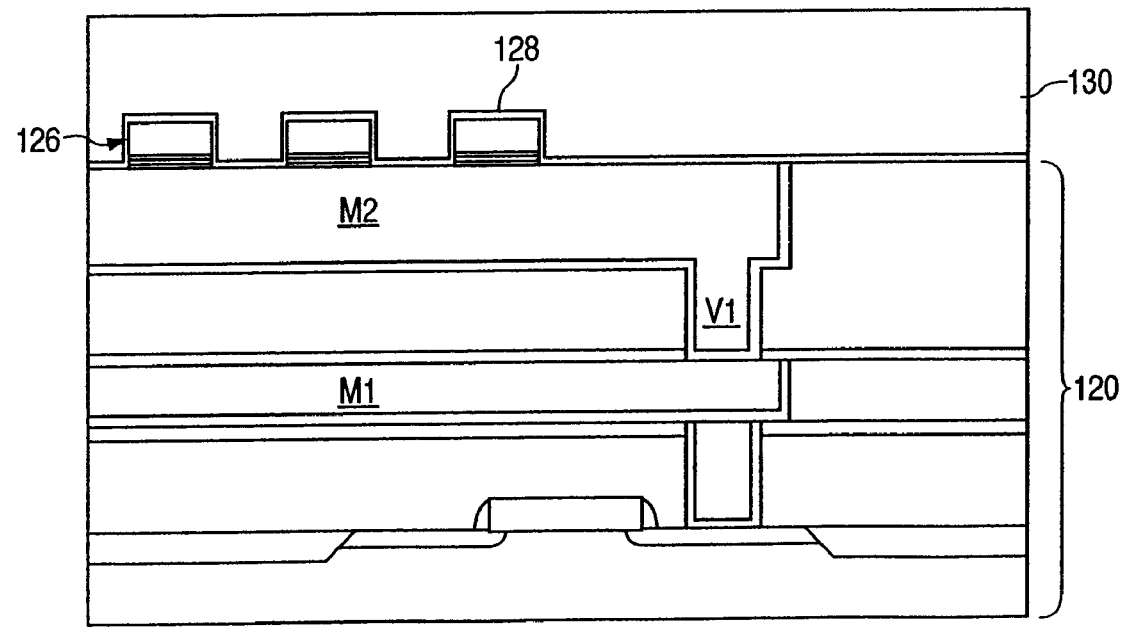

Referring now to FIG. 5, another interlevel dielectric layer 130 is blanket deposited over the cap layer 128, in preparation for the formation of an upper metallization layer (M3) and a via level for interconnection between M2 and M3. Thus, the ILD layer 130 is deposited at a sufficient thickness for by M3 and V2 formation. As a result of the step heights created by the formation of the MTJ stacks 126 (and in particular due to the thickness of the hardmask layer 124), the deposition of ILD layer may result in nonplanarities 132 over the stacks 126. Accordingly, the ILD layer 130 may be planarized by chemical mechanical polishing (CMP) for example, as shown in FIG. 6, so long as a sufficient thickness for M3 and V2 is maintained. Alternatively, a thicker cap layer 128 (i.e., having a cap thickness equal to or greater than the total thickness of the MTJ stacks 126) may deposited and thereafter planarized. Then, the ILD layer 130 may be deposited at a smaller thickness, since it will already be formed at a sufficient planarity.

Figure 7:
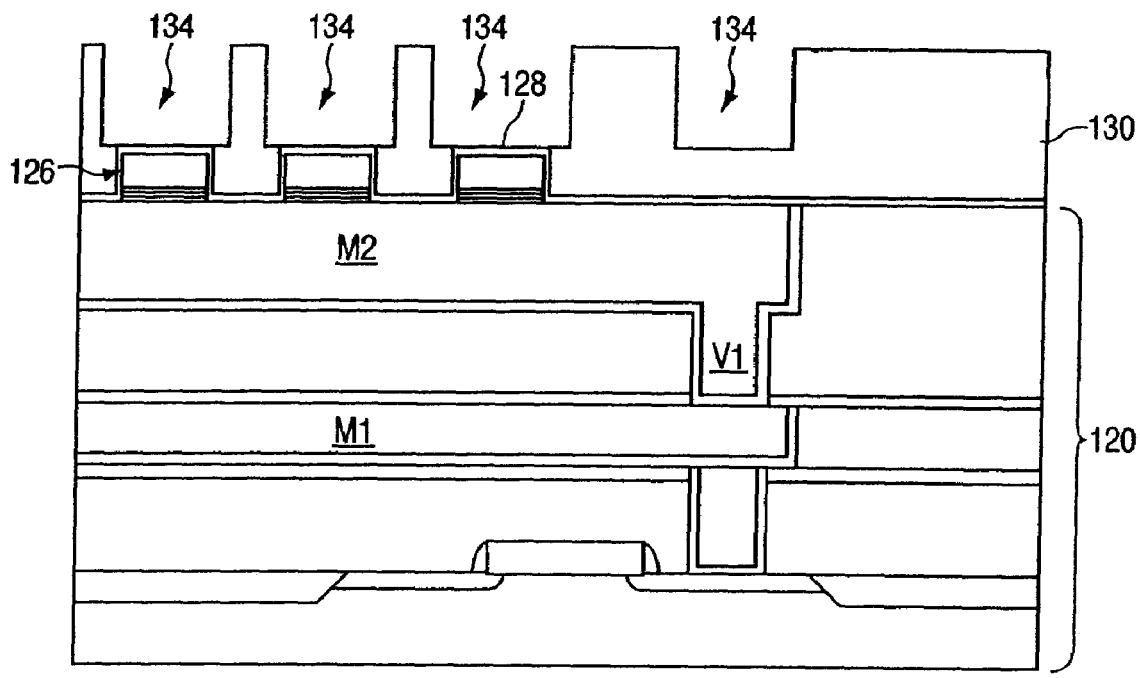
Figure 8:
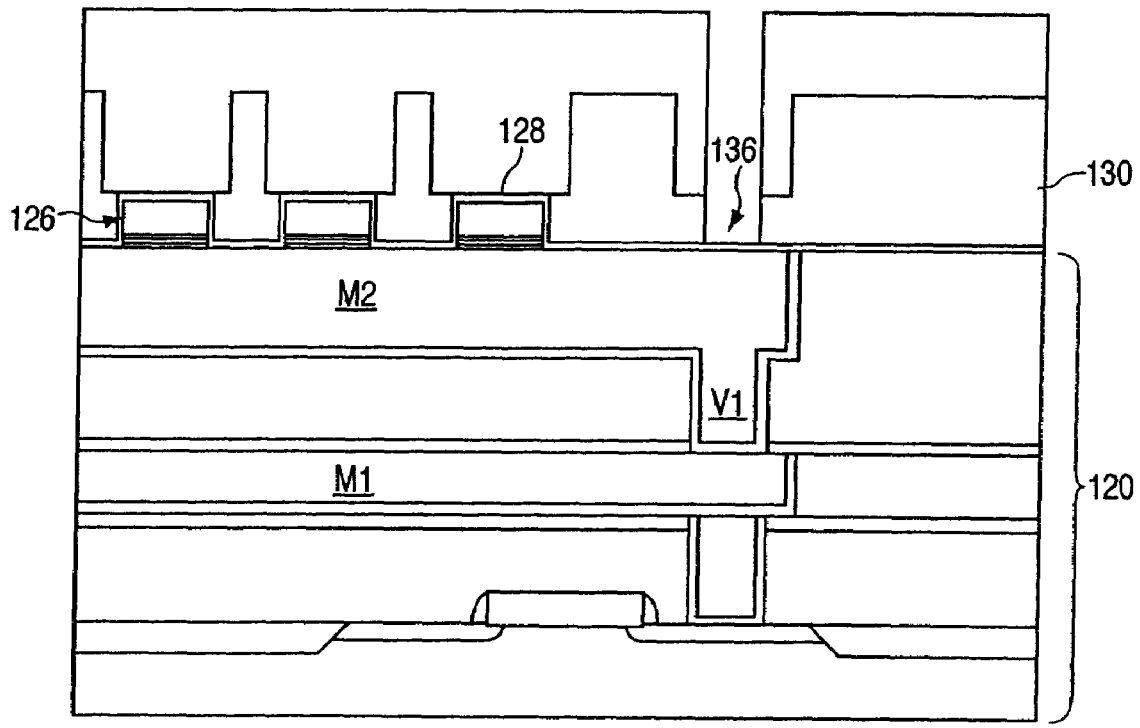
Figure 9:
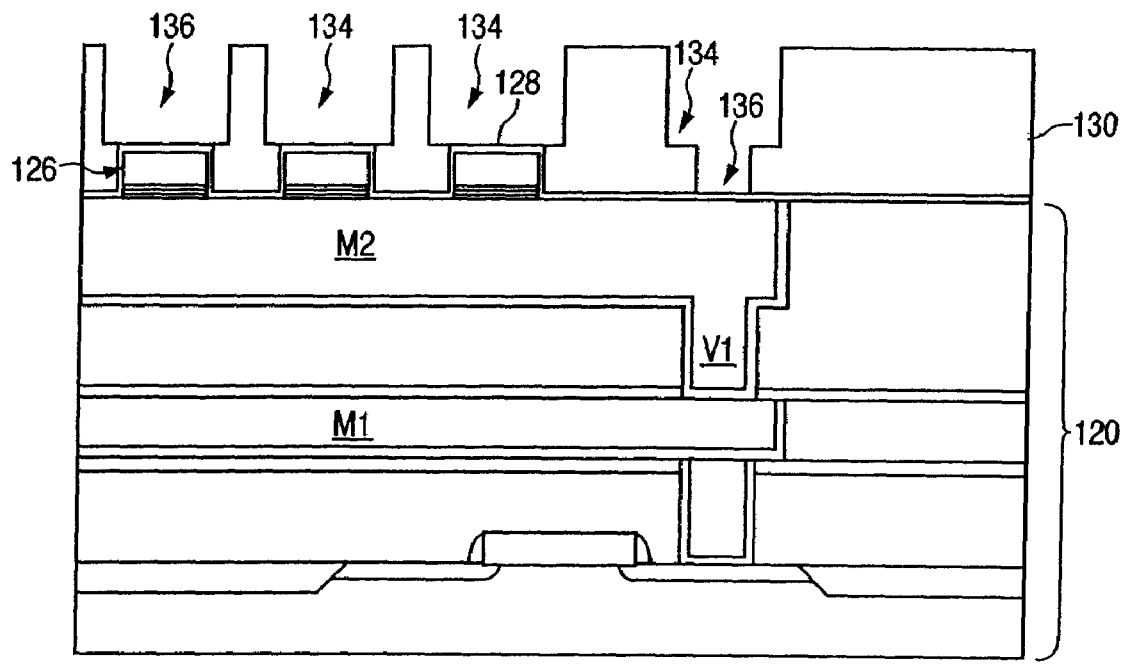

FIG. 7 illustrates the formation of M3 trenches 134 for a subsequent damascene metal process by lithography, patterning and RIE to transfer the desired pattern from a photo resist layer to ILD layer 130, wherein the cap layer 128 may serve as an etch stop for the M3 trench pattern in certain parts of the pattern. Following the etching of the M3 trenches 134, the remaining resist may either be stripped by cleaning or left in place for the next lithography and etch process in which the via openings 136 for V2 are defined, as shown in FIG. 8. As was the case for the definition of the M3 trenches, the cap layer 128 serves as an etch stop layer for the V2 definition. Upon completion of the V2 via opening formation, the remaining resist is stripped by a cleaning step, as shown in FIG. 9.

Figure 10:
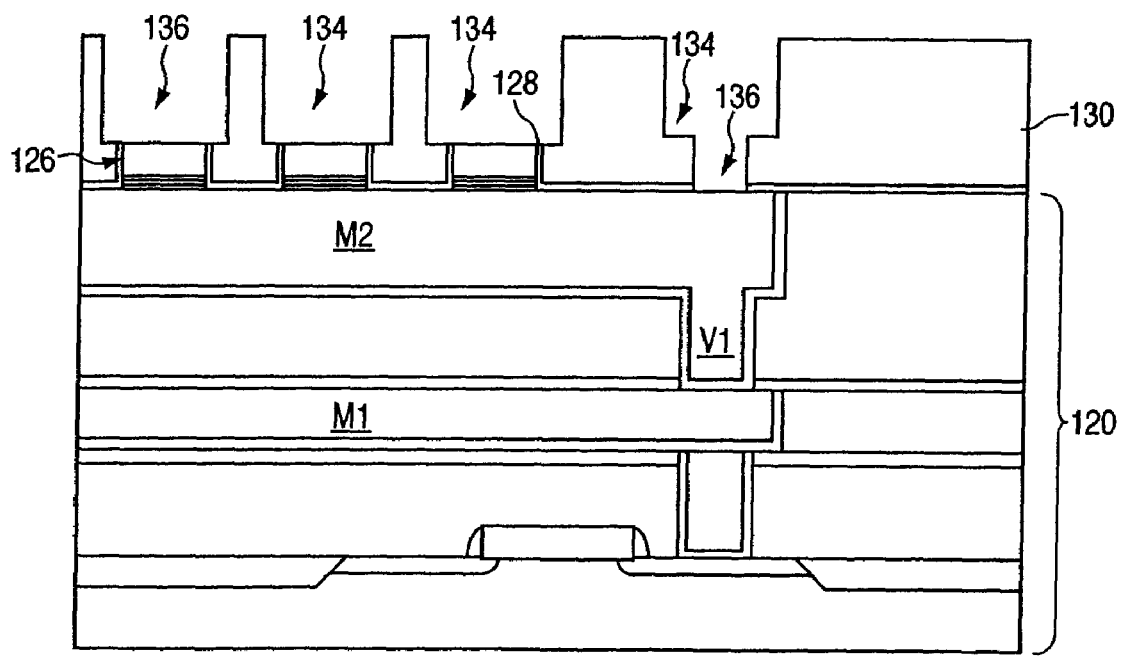
Figure 11:
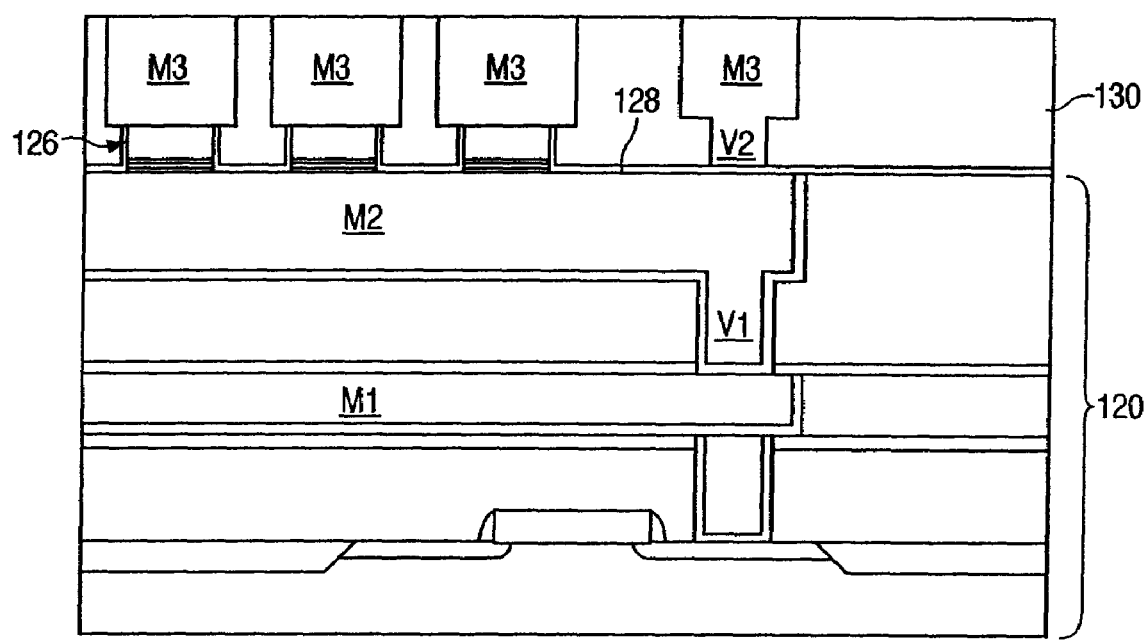

In FIG. 10, the cap layer 128 is removed (by etching, for example) in order to expose the hardmask layer 124 of the MTJ stacks 126, as well as those portions of M2 to be contacted by the V2 vias. However, as an alternative approach to the steps illustrated in FIGS. 7 and 8, the V2 openings may be lithographically patterned and etched first, with the cap layer 128 being used as an etch stop layer. Then, the M3 trench lithography and etching may be carried out, followed by the removal of the cap layer 128. In either case, the resulting structure will be the same as that shown in FIG. 10. Finally, as shown in FIG. 11, the metal fill of V2 and M3, along with subsequent planarization, is carried out in accordance with existing dual damascene processing techniques. This may include, for example, a copper (Cu) liner and seed layer deposition, followed by Cu plating and CMP.

The formation of the hardmask layer 124 as part of the MTJ stack 126 proves beneficial to the overall BEOL processing of the MRAM device in a number of aspects. First, the hardmask serves to define the MTJ stack 126 and is thus self-aligned to the stack. Second, because the hardmask is purposely made of an electrically conducting material, it ultimately serves as a functional part of the working device as an electrical conduit between the magnetic stack layer 122 and the M3 metallization lines. The conductive nature of the hardmask thereby eliminates the need for a separate processing level to create the connection to M3 (such as, for example, by a damascene via). The dual function of a hardmask, which itself becomes a self-aligned connective element in the finished device, simplifies the BEOL fabrication. Thus, the BEOL processing of MRAM devices is more enhanced than existing MRAM processing techniques, and is also more simplified and/or compatible as compared with the conventional Cu BEOL processes.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for forming an interconnect structure in a magnetic random access memory (MRAM) device, the method comprising:
    defining a magnetic stack layer on a lower metallization level, said magnetic stack layer including a non-ferromagnetic layer disposed between a pair of ferromagnetic layers;
    defining a conductive hardmask over said magnetic stack layer; and
    removing selected portions of said hardmask and said magnetic stack layer, thereby creating an array of magnetic tunnel junction (MTJ) stacks, said MTJ stacks including remaining portions of said magnetic stack layer and said hardmask;
    wherein said hardmask forms a self aligning contact between said magnetic stack layer and an upper metallization level subsequently formed above said MTJ stacks;
        depositing a cap layer over said MTJ stacks and exposed portions of said lower metallization level;
        depositing an interlevel dielectric (ILD) layer over said cap layer; and
        defining openings for said upper metallization level in said ILD layer;
        wherein portions of said cap layer atop said MTJ stacks are used as an etch stop.

2. The method of claim 1, further comprising:
    defining via openings in said ILD layer, wherein portions of said cap layer atop said lower metallization level are used as an etch stop.

3. The method of claim 2, further comprising:
    removing portions of said cap layer exposed by said upper metallization openings and said via openings; and
    filling said upper metallization openings and said via openings with a conductive material by dual damascene processing.

4. The method of claim 1, wherein said hardmask comprises a conductive material selected from the group of: tantalum, tungsten, titanium, tantalum nitride, tungsten nitride, titanium nitride, and combinations comprising at least one of the foregoing.

5. The method of claim 1, wherein said cap layer comprises silicon nitride.

6. A method for forming an interconnect structure in a magnetic random access memory (MRAM) device, the method comprising:
    defining a magnetic stack layer on a lower metallization level, said magnetic stack layer including a non-ferromagnetic layer disposed between a pair of ferromagnetic layers;
    defining a conductive hardmask over said magnetic stack layer; and
    removing selected portions of said hardmask and said magnetic stack layer, thereby creating an array of magnetic tunnel junction (MTJ) stacks, said MTJ stacks including remaining portions of said magnetic stack layer and said hardmask;
    wherein said hardmask forms a self aligning contact between said magnetic stack layer and an upper metallization level subsequently formed above said MTJ stacks;
    depositing a cap layer over said MTJ stacks and exposed portions of said lower metallization level;
    depositing an interlevel dielectric (ILD) layer over said cap layer; and
    defining via openings in said ILD layer, wherein portions of said cap layer atop said lower metallization level are used as an etch stop.

7. The method of claim 6, further comprising:
    subsequent to defining said via openings, defining openings for said upper metallization level in said ILD layer;
    wherein portions of said cap layer atop said MTJ stacks are used as an etch stop.

8. The method of claim 7, further comprising:
    removing portions of said cap layer exposed by said upper metallization openings and said via openings; and
    filling said upper metallization openings and said via openings with a conductive material by dual damascene processing.

9. A magnetic random access memory (MRAM) device, comprising:
    a magnetic stack layer formed on a lower metallization level, said magnetic stack layer including a non-ferromagnetic layer disposed between a pair of ferromagnetic layers;
    a conductive hardmask layer formed over said magnetic stack layer; and
    an array of magnetic tunnel junction (MTJ) stacks, said MTJ stacks created by the removal of selected portions of said hardmask layer and said magnetic stack layer, wherein said MTJ stacks including remaining portions of said magnetic stack layer and said hardmask layer, and wherein said hardmask layer forms a self aligning contact between said magnetic stack layer and an upper metallization level formed above said MTJ stacks;
    a cap layer deposited over said MTJ stacks and exposed portions of the lower metallization level;
    an interlevel dielectric (ILD) layer deposited over said cap layer; and a plurality of upper metallization level openings formed in said ILD layer;
wherein portions of said cap layer atop said MTJ stacks are used as an etch stop for said upper metallization openings.

10. The MRAM device of claim 9, further comprising:
a plurality of via openings defined in said ILD layer, wherein portions of said cap layer atop said lower metallization level are used as an etch stop for said via openings.

11. The MRAM device of claim 10, further comprising:
a conductive material filled into said upper metallization openings and said via openings, wherein said conductive material contacts lower metallization level and said hardmask layer after removal of portions of said cap layer.

12. The MRAM device of claim 9, wherein said hardmask layer comprises a conductive material selected from the group of: tantalum, tungsten, titanium, tantalum nitride, tungsten nitride, titanium nitride, and combinations comprising at least one of the foregoing.

13. The MRAM device of claim 9, wherein said cap layer comprises silicon nitride.

* * * * *